(12) United States Patent
Yeh et al.

(10) Patent No.: US 6,294,834 B1
(45) Date of Patent: Sep. 25, 2001

(54) STRUCTURE OF COMBINED PASSIVE ELEMENTS AND LOGIC CIRCUIT ON A SILICON ON INSULATOR WAFER

(75) Inventors: Wen-Kuan Yeh, Chupei; Chih-Yung Lin, Taichung Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/514,217

(22) Filed: Feb. 25, 2000

(30) Foreign Application Priority Data

Jan. 21, 2000 (TW) .......................... 89100969 A

(51) Int. Cl.[7] .................. H01L 29/40; H01L 27/01; H01L 29/00; H01L 23/52; H01L 23/48
(52) U.S. Cl. .................. 257/758; 257/347; 257/536; 257/537; 257/538; 257/350; 257/533; 257/532; 257/748
(58) Field of Search .................. 257/758, 347, 257/536, 537, 538, 350, 533, 532, 748

(56) References Cited

U.S. PATENT DOCUMENTS

| 5,604,360 | * | 2/1997 | Zhang et al. | 257/72 |
| 5,654,573 | * | 8/1997 | Oashi et al. | 257/349 |
| 5,952,709 | * | 9/1999 | Yamazaki | 257/643 |
| 6,084,247 | * | 7/2000 | Yamazaki et al. | 257/58 |
| 6,121,658 | * | 9/2000 | Houston | 257/347 |
| 6,130,455 | * | 10/2000 | Yoshinouchi et al. | 257/347 |
| 6,160,269 | * | 12/2000 | Takemura et al. | 257/59 |
| 6,166,414 | * | 12/2000 | Miyazaki et al. | 257/369 |
| 6,174,803 | * | 1/2001 | Harvey | 438/638 |
| 6,222,270 | * | 4/2001 | Lee | 257/758 |

FOREIGN PATENT DOCUMENTS

| 4216667 | * | 8/1992 | (JP) | 27/108 |
| 0544229-A1 | * | 11/1992 | (JP) | 27/12 |
| 5129522 | * | 8/1993 | (JP) | 27/4 |

\* cited by examiner

*Primary Examiner*—Matthew Smith
*Assistant Examiner*—Chuong A Luu
(74) *Attorney, Agent, or Firm*—Thomas, Kayden, Horstemeyer & Risley, LLP

(57) ABSTRACT

A structure of combined passive elements and logic circuits on a SOI (Silicon On Insulator) wafer. By combining passive elements (including a resistor, an inductor and a capacitor) with a logic device on a SOI wafer with dual damascene technology, an extremely thick inductor that effectively reduces the resistance of the inductor can be formed while also reducing the layout area. The invention is compatible with conventional VLSI technology without increasing number of masks or process steps. Furthermore, because the resistor of the invention is composed of single crystal Si, the resistor has high stability and low noise. Therefore, the structure according to the invention is suitable for RF device design and is also suitable for a System On Chip design.

8 Claims, 1 Drawing Sheet

STRUCTURE OF COMBINED PASSIVE ELEMENTS AND LOGIC CIRCUIT ON A SILICON ON INSULATOR WAFER

CROSS-REFERENCE TO RELATED APPLICATION

This application claims the priority benefit of Taiwan application serial no. 89100969, filed Jan. 21, 2000.

BACKGROUND OF THE INVENTION

1. Field of the Invention

The invention relates to a structure of combined passive elements and logic circuits, and more particularly to a structure of combined passive elements and logic circuits on a SOI (Silicon On Insulator) wafer, which combined passive elements include resistors, inductors, capacitors and logic devices formed on a SOI wafer by using dual damascene technology, so that the layout area can be significantly decreased.

2. Description of the Related Art

In the semiconductor manufacture process, the damascene technology is an interconnects process, in which a groove is formed in an insulating layer and the groove is filled with metal to form a pin. Dual damascene is a multilevel interconnects process, in which not only a single groove, but also a via opening is formed.

For example, in the standard dual damascene process, an insulating layer is coated with a photoresist material. In this process, the photoresist layer is exposed to form a first mask with a via opening pattern, and the top of insulating layer is anisotropically etched to form the pattern. After removing the photoresist layer that has been transferred, the insulating layer is then coated with a photoresist material. In this process, the photoresist layer is exposed to form a second mask with the via opening alignment pattern. While etching the pin layer opening in the top of insulating layer, the via opening in the top of insulating layer is etched to the bottom of the insulating layer. When the etching process is finished, the via opening and the groove are then filled with metal. Dual damascene can be improved in a single metal damascene, because the dual damascene process allows the via opening and the groove to be filled with metal, simultaneously, so that many process steps can be eliminated. Therefore, the dual damascene process is a key technology to push the design rule for sub-0.18 um or lower technology.

The SOI technology is a new technology that has been employed throughout the wafer manufacturing industry. Compared to the device formed on a bulk wafer, the device formed on a SOI wafer has more advantages. For example, the SOI device has a lower power consumption, a low threshold operation and high performance advantages. These qualities are the result of manufacturing the silicon device in an isolated substrate so as to avoid the conventionally problematic inherent parasitic capacitance in the junction capacitor. Therefore, the reason for improving the SOI technology is to reduce parasitic capacitance so that the power consumption is minimized and operation speed in a specific dimension device is maximized. The use of a SOI wafer can disable the latch up effect in CMOS, and can decrease the soft error effect in MOS as well as increase the circuit operation speed.

In the conventional passive element fabrication process, which requires many complex steps, especially in the process in logic circuit of passive element, multilevel metal interconnects are a major key technology. As the process technology progresses to a level such as 0.18 um or less, device dimension is tends to be fabricated with the minimum size.

For a mixed mode circuit, many passive elements such as inductors, capacitors and resistors are required. Furthermore, due to products with increasingly smaller size, such as the notebook computer, fabrication of many devices with smaller dimensions is required. Hence, how to combine many different devices on a chip in order to reduce layout area is a present aspect of development.

SUMMARY OF THE INVENTION

The invention provides an improved structure of combined passive elements and logic circuits on a SOI wafer. The structure comprises a first oxide layer formed on a silicon substrate, a SOI substrate formed on the first oxide layer, a first shallow trench isolation layer formed on the first oxide layer and adjacent to the SOI substrate, a first single crystal Si resistor layer formed on the first oxide layer and adjacent to the first shallow trench isolation layer, a second shallow trench isolation layer formed on the first oxide layer and adjacent to the first single crystal Si resistor layer, a second single crystal Si resistor layer formed on the first oxide layer and adjacent to the second shallow trench isolation layer, a transistor formed on the SOI substrate, and a capacitor formed on the first single crystal Si resistor layer. The capacitor is composed of a lower electrode, a second oxide layer and a upper electrode, which are stacked sequentially, wherein the lower electrode is electrically connected to the first single crystal Si resistor layer. A dielectric layer over the silicon substrate, and a first via opening, a second via opening, a third via opening and a fourth via opening are formed in the dielectric layer. The first via opening is filled with a first multilevel interconnects layer, which is electrically connected to the second single crystal Si resistor layer electrically. The second via opening is filled with a second multilevel interconnects layer, which is electrically connected to the upper electrode of the capacitor. The third via opening is filled with a third multilevel interconnects layer and is electrically connected to the lower electrode of the capacitor. The fourth via opening is filled with a fourth multilevel interconnects layer, which is electrically connected to the third multilevel interconnects layer and the gate of the transistor.

To achieve these and other advantages and in accordance with the purpose of the invention, as embodied and broadly described herein, the invention provides a new structure of combined passive elements and logic circuits on a SOI wafer, in which, by combining passive elements (including a resistor, an inductor and a capacitor) with a logic device on a SOI wafer with copper or aluminum dual damascene technology, an extremely thick inductor can be formed vto reduce the resistance of the inductor effectively, while simultaneously reducing the layout area. The invention is compatible with conventional VLSI technology without increasing number of masks or process steps. Furthermore, because the resistor of the invention is composed of single crystal Si, the resistor has high stability and low noise. Therefore, the structure according to the invention is suitable for RF device design and also is suitable for System On Chip design.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
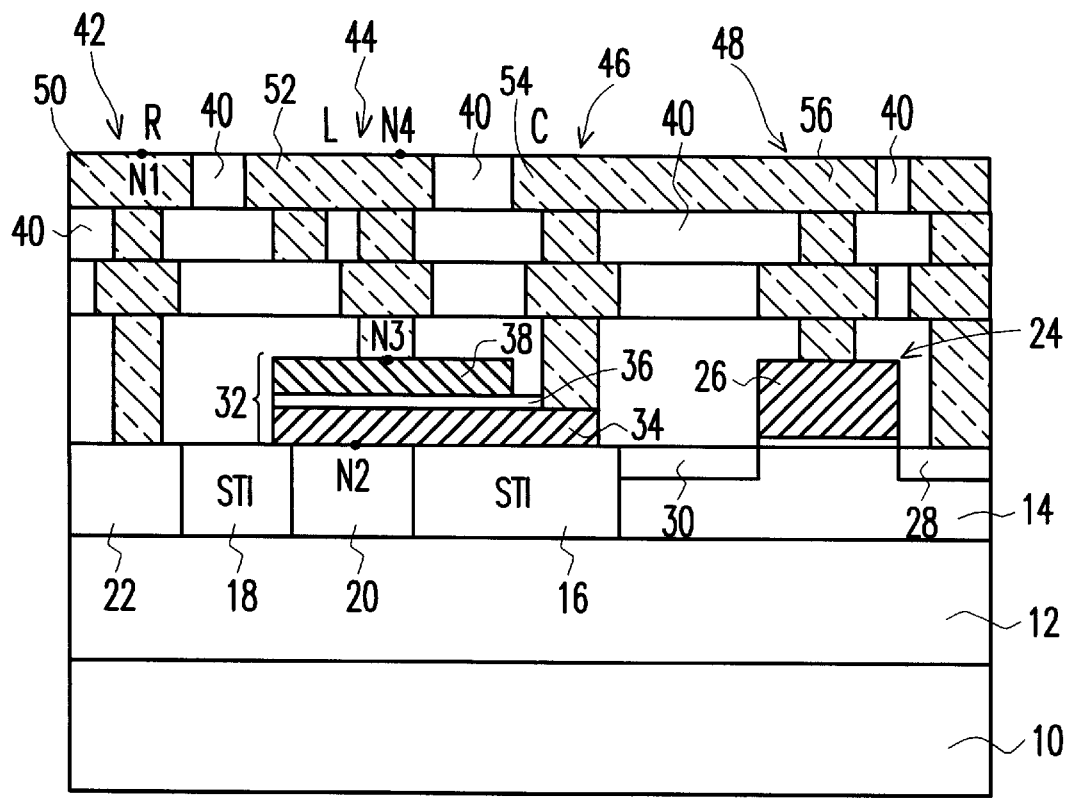
FIG. 1 is a cross-sectional view showing a structure of combined passive elements and logic circuits on a SOI wafer according to the preferred embodiment of the present invention.

Reference is made to FIG. 1, which is a cross-sectional view showing a structure of combined passive elements and logic circuits on a SOI wafer according to the preferred embodiment of the present invention.

The structure according to the present invention comprises an oxide layer 12 formed on a silicon substrate 10. A SOI substrate 14, shallow trench isolation (STI) layer 16 and 18, and single crystal Si resistor layers 20 and 22 are formed on the oxide layer 12. Shallow trench isolation layer 16 is formed between SOI substrate 14 and single crystal Si resistor layer 20, and the shallow trench isolation layer 18 is formed between single crystal Si resistor layer 20 and 22. It should be noted that single crystal Si resistor layers 20 and 22 both can be formed while the shallow trench isolation layer 16 and 18 are formed. The SOI substrate 14 is defined as a active element region, and the shallow trench isolation layers 16, 18 and single crystal Si resistor layers 20, 22 are defined as a passive element region.

A transistor 24 is formed on the SOI substrate 14 in the active element region. The transistor 24 is composed of a gate 26, a source 28 and a drain 30. A capacitor 32 is formed on the single crystal Si resistor layer 20, wherein the capacitor 32 is composed of a lower electrode 34, an oxide layer 36 and an upper electrode 38, which are stacked sequentially. The lower electrode 34 is electrically connected to the single crystal Si resistor layer 20. The lower electrode 34 of the capacitor 32 and the gate 26 of the transistor 24 both are formed simultaneously, and both are formed using conductive material that comprises polysilicon or metal. The upper electrode 38 of the capacitor 32 is formed from conductive material that comprises polysilicon or metal.

A dielectric layer 40 has a multilevel structure which is formed on the silicon substrate 10. A plurality of via openings 42, 44, 46 and 48 are formed in the dielectric layer 40, and the dielectric layer 40 is formed from material that comprises oxide. The via opening 42 is filled with a multilevel interconnects layer 50, which is electrically connected to the single crystal Si resistor layer 22. The via opening 44 is filled with a multilevel interconnects layer 52, which is electrically connected to the upper electrode 38 of the capacitor 32. The via opening 46 is filled with a multilevel interconnects layer 54, which is electrically connected to the lower electrode 34 of the capacitor 32. The via opening 48 is filled with a multilevel interconnects layer, and is electrically connected to the multilevel interconnects layer 54, while the multilevel interconnects layer 56 is electrically connected to the gate 26 of the transistor 24. Multilevel interconnects layer 50, 52, 54 and 56 are formed using a technique that comprises the combination of dual damascene technology with a copper (Cu) or aluminum (Al) process.

The structure and fabrication process of the present invention is compatible with conventional VLSI technology. That is, the single crystal Si resistor layers 20, 22 and the active element region (SOI substrate 14) are defined after the shallow trench isolation layer 16 and 18 are formed. Then, an internal CMOS device, such as the transistor 24 and capacitor 32 in FIG. 1, is formed on the SOI substrate 14. Finally, inductor L and all of multilevel interconnects layer 50, 52, 54 and 56 are formed in a dual damascene process after the via openings 42, 44, 46 and 48 are formed.

In the structure of the present invention as shown in FIG. 1, multilevel interconnects layer 50 corresponds to a resistor R, multilevel interconnects layer 52 corresponds to a inductor L, and multilevel interconnects layer 54 corresponds to a capacitor C. With the dual damascene process in the present invention, inductor L can be formed with very high thickness, thus the resistance of inductor L can be reduced. Thus, we can combine a resistor R, a capacitor C and an inductor L with a logic device on a SOI wafer by using a copper or aluminum dual damascene process.

Figure 2:
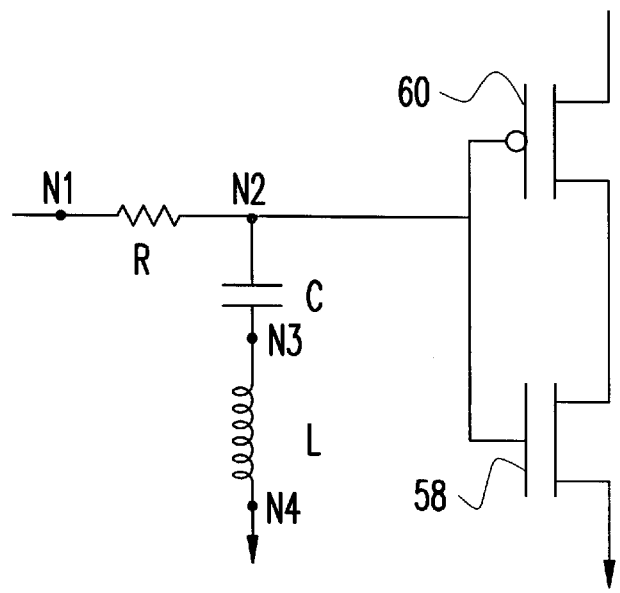
FIG. 2 is a circuit diagram of the combination of a resistor R, an inductor L and a capacitor C with a SOI device, which correspond to the structure in FIG. 1.

Reference is simultaneously made to FIG. 1 and FIG. 2. FIG. 2 is a circuit diagram of the combination of a resistor R, an inductor L and a capacitor C with a SOI device, which corresponds to the structure shown in FIG. 1.

The circuit in FIG. 2 comprises a resistor R, a capacitor C, a inductor L and a CMOS transistor (that is, a SOI device) which is composed of an NMOS transistor 58 and a PMOS transistor 60. The conventional structure of the resistor R is composed of polysilicon, while the present invention structure of the resistor R is composed of single crystal Si; thus the resistor R of the present invention has high stability and low noise.

Referring to FIG. 1 and FIG. 2, again, the nodes N1, N2, N3 and N4 in passive elements R, L, C in FIG. 1 correspond to each node N1, N2, N3 and N4 in FIG. 2, respectively. The lower electrode 34 of the capacitor 32 is electrically connected to the single crystal Si resistor layer 20, which is connected to the gate 26 of the transistor 24 through multilevel interconnects layer 54 and 56, sequentially, as shown in FIG. 1. This corresponds to the node N2 between the resistor R and capacitor C, which then is connected to the gate of NMOS transistor 58 and PMOS transistor 60 as shown in FIG. 2.

Additionally, because a SOI device is very suitable for RF device design, the combined RLC circuit with SOI logic device is a very promising design for frequency circuit design, in which the layout area can be greatly reduced. Furthermore, the structure according to the present invention is also suitable for a System On Chip (SOC) design.

Accordingly, the invention has the following advantages:
 (1) By combining a resistor, an inductor and a capacitor with a logic device on a SOI wafer with copper or aluminum dual damascene technology, the layout area can be greatly reduced.
 (2) The invention is compatible with conventional VLSI technology without increasing number of masks or process steps.
 (3) The resistor of the present invention has high stability and low noise because the resistor is composed of single crystal Si.
 (4) With the dual damascene process, the inductor of the present invention can be formed with very high thickness, thus the resistance of inductor L can thus be reduced effectively.
 (5) The invention is suitable for RF device design.
 (6) The invention is suitable for a System On Chip design.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A structure of combined passive elements and logic circuits on a Silicon On Insulator (SOI) wafer, comprising:
   a silicon substrate;
   a first oxide layer formed on the silicon substrate;
   a SOI substrate formed on the first oxide layer;
   a first shallow trench isolation layer formed on the first oxide layer and adjacent to the SOI substrate;
   a first single crystal Si resistor layer formed on the first oxide layer and adjacent to the first shallow trench isolation layer;
   a second shallow trench isolation layer formed on the first oxide layer and adjacent to the first single crystal Si resistor layer;
   a second single crystal Si resistor layer formed on the first oxide layer and adjacent to the second shallow trench isolation layer;
   a transistor formed on the SOI substrate;
   a capacitor formed on the first single crystal Si resistor layer, wherein the capacitor comprises a lower electrode, a second oxide layer and an upper electrode, which are stacked sequentially, wherein the lower electrode is electrically connected to the first single crystal Si resistor layer;
   a dielectric layer over the silicon substrate, wherein a first via opening, a second via opening, a third via opening and a fourth via opening are formed in the dielectric layer;
   a first multilevel interconnects layer filling in the first via opening and electrically connected to the second single crystal Si resistor layer;
   a second multilevel interconnects layer filling the second via opening and electrically connected to the upper electrode of the capacitor;
   a third multilevel interconnects layer filling the third via opening and electrically connected to the lower electrode of the capacitor; and
   a fourth multilevel interconnects layer filling the fourth via opening and electrically connected to the third multilevel interconnects layer and the gate of the transistor.

2. The structure of combined passive elements and logic circuits on a SOI wafer according to claim 1, wherein the first and the second single crystal Si resistor layer both are formed simultaneously with formation of the first and the second shallow trench isolation layer.

3. The structure of combined passive elements and logic circuits on a SOI wafer according to claim 1, wherein the lower electrode of the capacitor and the gate of the transistor are formed simultaneously.

4. The structure of combined passive elements and logic circuits on a SOI wafer according to claim 1, wherein the lower electrode of the capacitor and the gate of the transistor are formed using material that comprises polysilicon or metal.

5. The structure of combined passive elements and logic circuits on a SOI wafer according to claim 1, wherein the upper electrode of the capacitor is formed from a material chosen from the group composed of polysilicon and metal.

6. The structure of combined passive elements and logic circuits on a SOI wafer according to claim 1, wherein the dielectric layer is formed from a material that comprises oxide.

7. The structure of combined passive elements and logic circuits on a SOI wafer according to claim 1, wherein the first, the second, the third and the fourth multilevel interconnects layer are formed by a process that combines dual damascene technology with copper process.

8. The structure of combined passive elements and logic circuits on a SOI wafer according to claim 1, wherein the first, the second, the third and the fourth multilevel interconnects layer are formed by a process that combines dual damascene technology with aluminum process.

* * * * *